United States Patent [19]
Aulas et al.

[11] Patent Number: 5,652,720
[45] Date of Patent: Jul. 29, 1997

[54] ELECTRICALLY PROGRAMMABLE MEMORY WITH IMPROVED RETENTION OF DATA AND A METHOD OF WRITING DATA IN SAID MEMORY

[75] Inventors: Maxence Aulas, Saint Haon le Vieux; Alessandro Brigati, Aix en Provence; Nicolas Demange, Lessy; Marc Guedj, Pont Saint Esprit, all of France

[73] Assignee: SGS-Thomson Microelectronics S.A., Saint Genis, France

[21] Appl. No.: 573,897

[22] Filed: Dec. 18, 1995

[30] Foreign Application Priority Data

Dec. 20, 1994 [FR] France .................... 94 15348

[51] Int. Cl.$^6$ .................... G11C 11/34
[52] U.S. Cl. .................... 365/185.09; 365/185.3; 365/185.2
[58] Field of Search .................... 365/185.09, 185.22, 365/185.2, 185.24, 185.3

[56] References Cited

U.S. PATENT DOCUMENTS

| | | | |
|---|---|---|---|
| 4,218,764 | 8/1980 | Furuta et al. | 365/222 |
| 4,763,305 | 8/1988 | Kuo | 365/200 |
| 5,200,922 | 4/1993 | Rao | 365/185.09 |
| 5,239,505 | 8/1993 | Fazio et al. | 365/185 |
| 5,262,984 | 11/1993 | Noguchi et al. | 365/185.06 |
| 5,278,794 | 1/1994 | Tanaka et al. | 365/185.09 |
| 5,321,655 | 6/1994 | Iwahashi et al. | 365/185.09 |
| 5,335,198 | 8/1994 | Van Buskirk et al. | 365/185.09 |
| 5,365,486 | 11/1994 | Schreck | 355/222 |
| 5,377,147 | 12/1994 | Merchant et al. | 365/185.09 |
| 5,465,236 | 11/1995 | Naruke | 365/185.33 |

OTHER PUBLICATIONS

French Search Report from French Patent Application 94 15348, filed Dec. 20, 1994.

*Primary Examiner*—David C. Nelms
*Assistant Examiner*—Michael T. Tran
*Attorney, Agent, or Firm*—Wolf, Greenfield & Sacks, P.C.; James H. Morris

[57] ABSTRACT

The present invention concerns an electrically programmable memory and a method for writing within this memory. In order to avoid the degradation of information in a memory cell following a number of write cycles in the other cells of the same row, the present invention includes a sequence to be carried out before each write cycle of a word within a row. A systematic reading of all the words of a row by using three different read reference potentials is performed in order to find a cell that gives non-compatibility results between any two of the three read cycles. The words of the row are stored in a register. If a non-compatible result is found, which indicates a degradation of information in the row, a systematic re-write of all the words of the row is carried out.

49 Claims, 2 Drawing Sheets

ELECTRICALLY PROGRAMMABLE MEMORY WITH IMPROVED RETENTION OF DATA AND A METHOD OF WRITING DATA IN SAID MEMORY

BACKGROUND OF THE INVENTION

1. Field of the Invention

The present invention concerns non-volatile electrically programmable and erasable memories.

The present invention particularly concerns EEPROM type memories. However, the present invention is applicable to memories implemented in different technologies in which similar problems are posed.

2. Discussion of the Related Art

In order to register data, i.e. store data, EEPROM memories store electrical charge on a floating gate of a transistor. Floating gate transistors also have an associated control gate. The floating gate transistor may be made to conduct by the application of a read voltage that is applied to the control gate. According to the quantity of charge stored on the floating gate, the conduction threshold of the transistor varies. It is this variation of threshold voltage that allows one to determine whether the transistor is erased or programmed.

As a consequence, the reading of data is carried out by applying a determined reference potential to the control gate. This reference potential is carefully chosen such that it is midway between the conduction threshold voltage of a programmed transistor and the conduction threshold voltage of an erased transistor. Therefore, if the transistor is programmed it will be made to conduct by the application of the reference potential to its floating gate; if it is erased it will not be made to conduct.

However, the quantity of electrical charge stored on the floating gate is difficult to control. Additionally, the time that the charge remains stored on the floating gate is not well controlled. Furthermore, the programming and erasing conduction threshold voltages are modified as a function of time. These conduction threshold voltages are notably modified as a function of the number of write, i.e. programming, or erase cycles that are executed by the memory.

It may happen that, because of the aging of the information, i.e. charge, contained in a memory cell, the information is such that the read circuit (that uses the reference potential) is not capable of determining with a sufficient amount of certainty whether a memory cell is erased or programmed. The possible causes of the aging of information will be discussed further on in this text.

SUMMARY OF THE INVENTION

An illustrative embodiment of the present invention proposes a solution in order to avoid the risks of excessive degradation of the information stored in a memory cell. This solution includes a sequence of original operations during the step of writing a word in the memory.

This sequence comprises a systematic verification of the information contained in the other words of a row of memory at the time of writing a word contained in this row, and a systematic re-writing of the words of this row where a degradation of information appears. It is considered that there is a degradation of information if at least one memory cell of a word supplies information with a risk of error that is abnormally high. It is possible to re-write all the words back into the row but it may be preferable to re-write only the defective word or words. Furthermore, if the memory is organized in bytes, it may be preferable to act upon a byte rather than on a complete word, if a word in a retained architecture comprises several bytes.

According to an embodiment of the present invention, a method for writing data in an electrically programmable memory, in order to write a word in a group of n memory cells (n being greater than or equal to 1), includes steps of reading the states of the memory cells of the row by using different read reference values, and verifying the compatibility of the readings carried out upon the same cell with the different reference values, and if an absence of compatibility is found in at least one cell of a word that is read, this cell of this row is re-written. Also, the required word is written into the group of selected cells.

Reference values are preferably three. But it is possible to carry out two reads only, particularly if it is discovered that one type of degradation is greater than another. This is particularly the case when it is read with a central value first and when, according to the state read, it is known that the degradation can have been produced in only one way.

In other words, a write cycle (being more generally a modification of cells that comprises an erase cycle, or more specifically, an erase cycle followed by the programming of the cells with a word) is preceded by a step of verifying the states of the other cells of the row. If there are no problems associated with the degradation of information (i.e. that the compatibility of the results of the three reads indicate that there is no excessive degradation of the states of the cells of the row), the step of writing a word is carried out. If, alternatively, there is a problem of degradation of information, the triple read cycle with respect to the different reference potentials will allow the detection of such a problem, its nature and the place of the degradation (i.e. the risk of losing the information in an erased cell, or alternatively, a programmed cell). Therefore, the defective cell is re-written. Accordingly, all the cells of a byte associated with the defective cell may be re-written. Furthermore, it may be preferable to write a word at the same time as the re-writing of a cell.

This solution of systematic verification before all write cycles allows one to detect and evaluate the risk of loss of information, notably the loss of information that is due to the degradation of a cell by the write cycles of the other cells of the same row.

In the case of a memory having transistors with floating gates, the read reference values may be the potentials applied to the control gates of these floating gate transistors. Thus, the reading of a floating gate transistor may be regarded as a type of comparison between these applied potentials and the conduction threshold voltage of an erased or programmed floating gate transistor. However, it should be understood that these reference values may be other voltages or currents, which will be chosen depending upon the particular technology and/or circuitry that is used to implement the memory. Notably, different reference voltage values may be applied to the drain and source terminals of the floating gate transistors of the cells.

For the read cycle, a central reference value, an auxiliary low reference value which is less than the central value and an auxiliary high reference value which is greater than the central value may be used. The central reference potential preferably corresponds to that which is substantially midway between the conduction threshold voltages that causes a cell to be erased and to be programmed.

The auxiliary reference values may be chosen such that they detect a predetermined amount of degradation of information, as will be described in more detail below.

Besides the method described above, an embodiment of the present invention equally provides as an object, an electrically programmable memory that comprises means for the carrying out three successive read cycles of the cells of a row (either a part of the row or the entire row). Before each writing of a word in this row, the three read cycles are carried out using three different reference potentials.

The memory which is organized in rows of words of at least one bit may comprise more precisely:

- a read circuit that is capable of reading the words of the memory with three different reference values;
- a register for storing the words read in a row of memory;
- a write sequencer that is capable of carrying out the following operations when it receives a write command for a word that has a determined location within a memory row: reading the state of the cells of a row of memory by using three different values of read references; systematically re-writing, if necessary, the defective cells of a row of memory that are stored in the register; and writing a required word to a word location within this row; and
- means for comparing the results of the read of the same cell with three reference values, these means being connected to the sequencer for providing a systematic re-write command of the cell if non-compatibility of the three results is detected.

It should be understood that it is not necessary to read all the words of a row with the three reference values once a non-compatibility that has been detected. The subsequent words may be read with a single reference potential (i.e. the standard read potential).

BRIEF DESCRIPTION OF THE DRAWINGS

Other characteristics and advantages of the present invention will become apparent from the following detailed description that is referred to attached diagrams in which.

DETAILED DESCRIPTION

One of the causes of the loss of information in a memory cell is discussed in more detail.

The risk of the loss of information comes from the principle of choice of potentials used for the writing and erasing of the memory cells in a memory that is arranged in the form of a matrix. In particular, this concept involves the fact that the cells are arranged in rows and columns, where all the control gates of the transistors with floating gates within the same row are connected together and all the sources of the transistors with floating gates are connected together, at least a priori. It is necessary however that the potentials applied to a transistor that is to be programmed or erased is selective such that it does not lead to the programming or erasure of any other transistors within the same row or same column.

Figure 1:
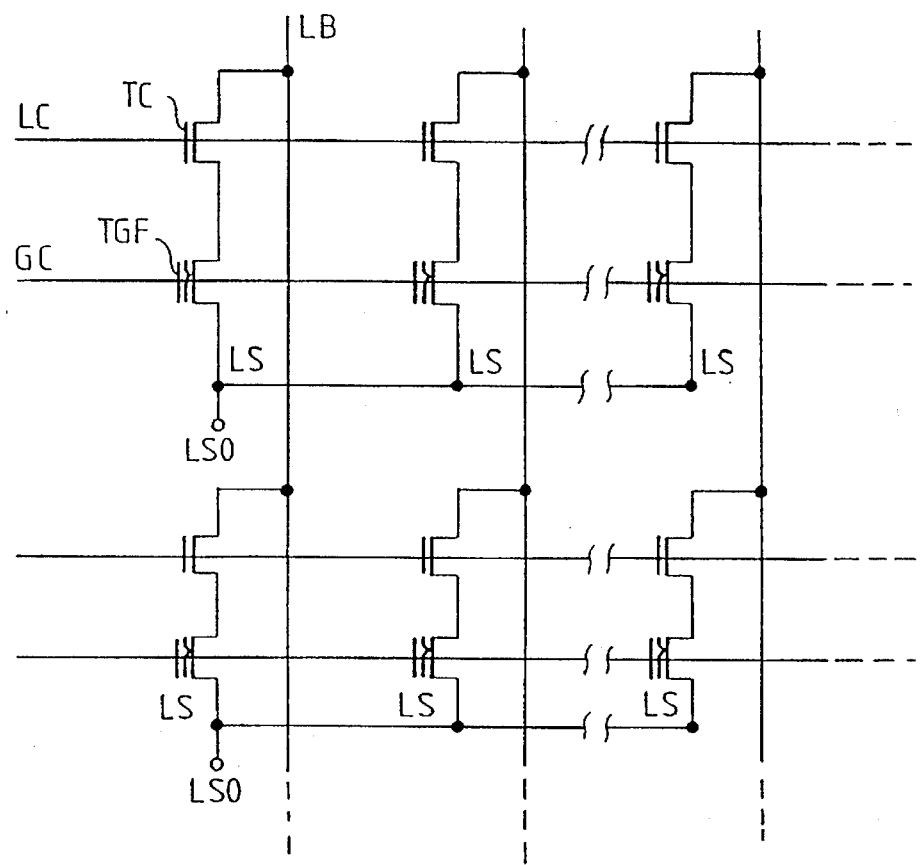
FIG. 1 represents an arrangement of cells of an EEPROM memory.

A classic arrangement of a network of cells within an EEPROM memory is represented in FIG. 1. Each cell comprises a transistor with a floating gate TGF and a control transistor TC. The floating gate transistor has a source connected to a source-line LS, which may be common to all of the network, a drain connected to the source of its associated control transistor and a control gate connected to a line GC that is common to all of the transistors within the same row. The drain of the control transistor TC is connected to a bit-line LB that is common to all the control transistors within the same column. And finally, the control gate of the control transistor is connected to a selection-line LC that is common to all the control transistors within the same row. In an example of the present invention, the source-lines of the cells of the same byte are connected to a common byte source-line LSO. FIG. 1 illustrates two bytes. The byte source-lines LSO are individually controllable by a decoder (not illustrated).

In order to erase a cell that is situated at the junction of a determined row and column, an erase voltage of approximately 15 volts is applied to the line GC in which the cell to be erased is situated. Simultaneously, 0 volts is applied to the source-line LS that corresponds to the cell to be erased and approximately 5 volts to the source-lines of the other cells. In practice, all the common source-lines of a byte LSO are subjected to the same voltage so that all the cells of a byte can be erased or saved at the same time. The erasure of a cell results from the large potential difference (15 volts) between the source and gate terminals of the selected floating gate transistor. The floating gate transistors, within the same row as the floating gate transistor that is to be erased, that are associated with different columns, or bytes, have a voltage difference between their source and gate terminals that is less than 15 volts (approximately 10 volts) and is such that it is not sufficient enough to erase the cells.

Likewise, the programming of a cell that is situated at the junction of a determined row and column is achieved by the application of a voltage of approximately −8 volts to the line GC (thus to the gates of the transistors with floating gates) and +5 volts or 0 volts to the drain of the floating gate TGF by applying +5 volts or 0 volts to the appropriate bit line LB and activating the control transistor TC. The value of +5 volts or 0 volts is applied according to whether the selected transistor is to be programmed or not. The resulting potential difference between the gate and drain is either 13 volts (which is sufficient for writing) for a selected cell or only 8 volts (which is insufficient for writing) for the other non-selected cells. A word of several bits is written into a group of cells (that have previously been erased) by putting 0 volts or 5 volts on the bit-lines of the different cells of a group, according to the value of the bits of the word. Prior art decoders already permit the simultaneous writing of the different cells of a group by applying the appropriate voltages on all the bit lines of the word.

However, although the appropriate protection voltages are applied to the transistors that are not required to be erased or programmed, during the erasing or programming of another transistor, it should be noted that these protection voltages have an influence upon the programming state of the transistors which receive these protection voltages.

In other words, the erasing or programming of a transistor slightly modifies the state of the charge on the floating gate of the other transistors of the same row.

It should be noted that this is one of the reasons why the conduction threshold voltage of an erased or programmed transistor changes, little by little, during the programming or erasing of the other cells, principally the cells of the same row.

Figure 2:
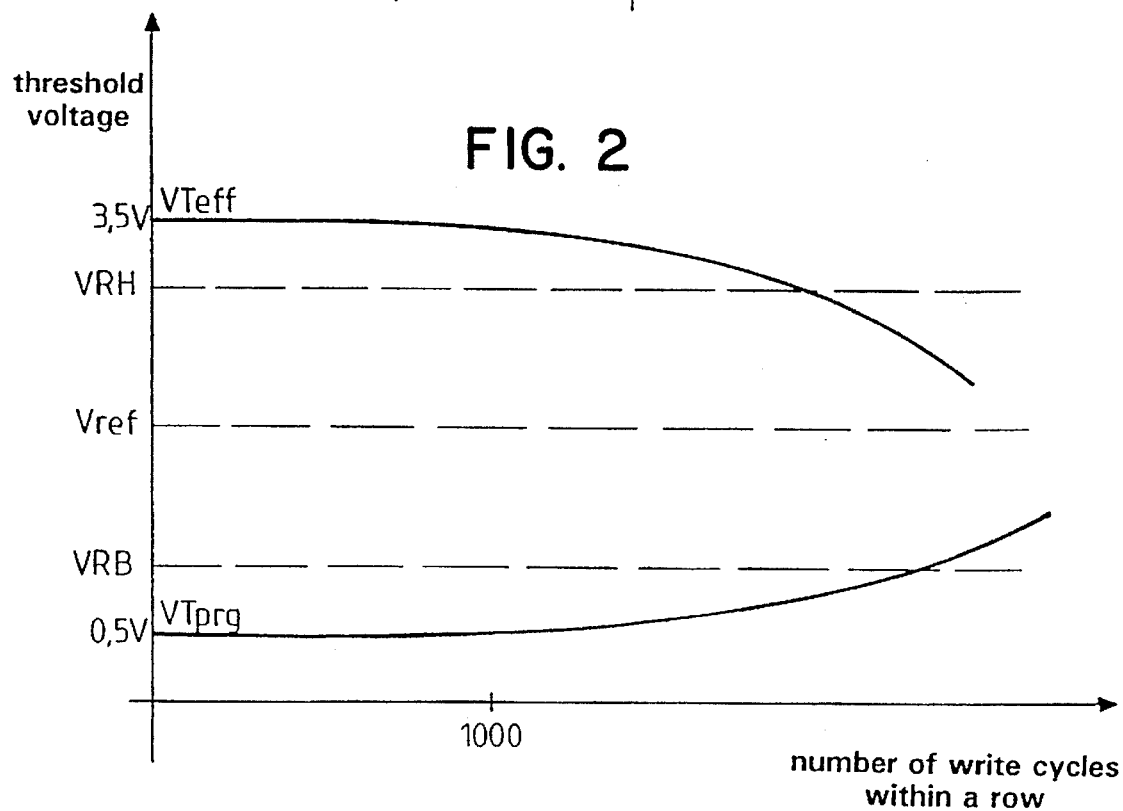
FIG. 2 illustrates curves that represents the typical variation of the conduction threshold voltages of an erased cell and a programmed cell as a function of the number of programming cycles of the other cells of the row.

The curves of FIG. 2 represent a typical variation of the conduction threshold voltages of a floating gate transistor of an EEPROM memory.

The change of the threshold voltage VTeff (an erased transistor) and of the threshold voltage VTprg (a programmed transistor) is represented as a function of the number of write cycles carried out within the memory. The reference voltage Vref is that which is applied to the control gate of the floating gate transistor in order to carry out a standard read operation.

It can be seen that the threshold voltages have a tendency to approach one another as a function of the number of write cycles. It thus becomes increasingly more difficult to be sure that these threshold voltages have not become too close to the reference voltage, which will result in a degradation of the information contained in the cell.

This is why a provision has been made, according to an embodiment of the present invention, for the systematic verification of the information by means of a triple read cycle, with respect to different reference potentials, and a re-write of the information if the results of the triple read cycle indicate a degradation of the charges contained in the floating gates of the cells. This verification is carried out, for a determined row, at the moment of writing a word in this memory row. The reason for this is that these are the write cycles of a word of a row which tend to degrade the information contained in the other words. As a consequence, there is the advantage that a row is verified each time that the row is written to. There is little or no need for the systematic verification of the rows that are rarely written to and especially cells that are not being written to.

The verification may be carried out for the entire row. The re-writing may also be carried out, if desired, for the entire row.

The three read cycles are made with respect to the following potentials:

a central reference potential Vref, that is preferably midway between the value of the programming threshold voltage VTprg of a floating gate transistor and the value of the erasing threshold voltage VTeff of a floating gate transistor;

an auxiliary high reference potential VRH that is greater than Vref but less than VTeff; and an auxiliary low reference potential VRB that is less than Vref but greater than VTprg.

As can be seen from FIG. 2, the reading of a programmed cell that has not been degraded by the number of write cycles of the other cells of the memory will give the same result at the moment of the reading, whether the read potential applied is Vref, VRH or VRB.

The transistor will always be conducting when all these read voltages are greater than the threshold voltage VTprg. Likewise, for an erased cell, the three read cycles do not allow the transistor to conduct, which in each case indicates an erased state.

However, after a number of write cycles to the other cells in the same row of the memory, the cell under consideration will be seen to have a decreased threshold voltage decreased if it is erased, or an increased threshold voltage if it is programmed.

Considering a first case: the results of the three read cycles agree with one another, i.e. the three readings are the same, and illustrate that the threshold voltage is greater than VRH; the conclusion being in this case that the cell is erased and that the information has not yet been degraded.

Considering a second case: the results of the three read cycles do not agree with one another, i.e. the three readings are not the same, and illustrate that the threshold voltage is contained between Vref and VRH; the conclusion being in this case that the cell is erased but the information is starting to degrade.

Considering a third case: the results of the three read cycles agree with one another and illustrate that the threshold voltage is less than VRB. It can be concluded in this case that the cell is programmed and that the information has not degraded.

Considering a fourth case: the results of the three read cycles do not agree with one another and illustrate that the threshold voltage is contained between VRB and Vref. It can be concluded in this case that the cell is programmed with degradation of the information.

In one embodiment, a write operation of an n bit word (where n is greater than or equal to 1) in a group of n cells of a row of memory comprises the following steps:

the successive systematic reading of all the words of the row, by using, at least from the start, the three reference potentials Vref, VRH, VRB; the reading with respect to the potential Vref provides an indication of the information stored; the reading with respect to the other reference potentials VRH and VRB provides, by comparison with the first reading, an indication of degradation (the second and fourth cases considered above) or non-degradation (the first and third cases considered above) of the information;

memorizing all the defective words in a register;

if at least one cell of a word comprises degraded information, the systematic re-writing of all the cells of this word is carried out by using the contents of the register; and the writing of a desired n bit word.

The writing of a desired word is preferably carried out at the same time as the re-writing of the word or words to re-write. Since the writing of data within EEPROM type memories is carried out by the tunnel effect, i.e. by the application of high voltages, there is no or little difficulty or penalty in subjecting as many lines as required to these high voltages because there is no current consummation.

Figure 3:
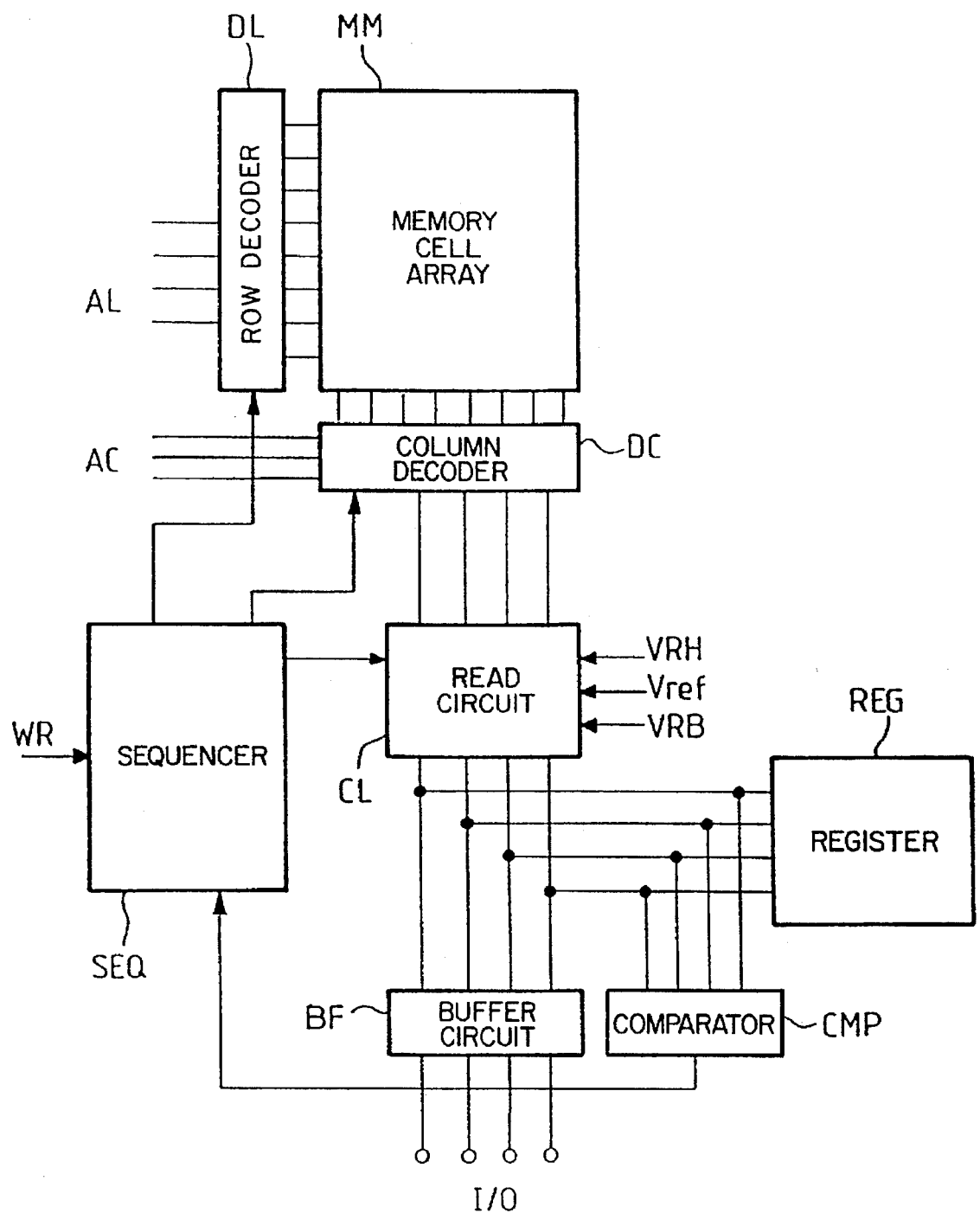
FIG. 3 represents a general structure of the memory according to an embodiment of the present invention.

A memory according to an embodiment of the present invention is represented in FIG. 3. It comprises a network or array MM of cells in rows and columns, for example with a row decoder DL and a column decoder DC. The row and column decoders DL, DC respectively receive a row address AL and a word address AC for the selected row. The column decoder controls the bit-lines and the connections LSO.

A read circuit CL allows the reading of the words with the three different reference potentials Vref, VRH, VRB. In the configuration of the memory of FIG. 1, the reference potentials are applied to the line GC.

A comparator CMP at the output of the read circuit allows the storage of the results of three successive read cycles and supplies information about the compatibility or the non-compatibility of the results of the three read cycles.

A register REG is connected to the output of the read circuit for storing if not all of the words of a row, read with the central reference potential Vref, at least those that are defective.

This register may return these words towards the memory for systematic re-writing if it is proved to be necessary. And finally, an automatic writer or sequencer SEQ executes the necessary sequential operations at the moment where a write command WR is given, so that the previous read cycle, verification and eventual re-writing are automatically carried out in the row that corresponds to the address of the word to write.

FIG. 3 also illustrates a buffer circuit BF that has been placed between the output of the read circuit and the inputs/outputs I/O of the memory, so as to store a word to write in the memory during the course of the operations of the systematic verification according to the present invention.

It should be noted that in FIG. 3, the write circuits have not been represented in the illustrated memory. It has been considered that the write circuits are well known to those skilled in the art and may be partially incorporated in the read circuit CL which must be considered transparent when writing a word originating from the inputs/outputs I/O or from the register REG.

In the sequence of the write operation with systematic reading of the complete row, it can be anticipated that the comparison between the normal reading with Vref and the two other readings with VRH and VRB may be carried out immediately at the time of the reading of each word and this is carried out for all the words of the memory row. The existence of degradation from at least one of the readings is detected and this information is sent to the sequencer. If two readings for the same cell are not compatible, time can be saved by not carrying out the third reading for this cell or rather for the byte. If one cell within a word has information that has degraded, then it is preferable that three read cycles are carried out on the other words or bytes of the same word row in order to only re-write, at the end of the procedure, those that are defective. When it is necessary to write a word, whose writing is justified by the procedure for three readings, the reading of the previous contents of this word can be avoided since the contents will in any case be changed. Thus, it is possible to gain on the time otherwise required for reading.

It is also possible to provide an alternative situation. As soon as degraded information has been detected, for example, the degraded information may be stored and the reading of the following words of a complete row are made only with Vref, with the aim of storing all of the words of the row in the register. In fact, once the degraded information is found, it is not necessary to find other degraded information within the row if a systematic re-write command for all the row is going to be given to the sequencer. In one embodiment, the execution of the rewrite command necessitates the reading and storing of all the words in the register REG.

Concerning the choice of the values VRH and VRB, they can be referenced to the typical threshold voltage curves associated with the erasure or programming of cells. The value VRH may be sufficiently close to VTeff so that a degradation can be detected in good time. The same applies to VRB and VTprg. But VRH may nevertheless be sufficiently distanced from VTeff such there is no or minimal risk (allowing for the tolerances of the characteristics of the cell) that VRH is greater than the threshold voltage VTeff of a cell that is clearly erased.

The same applies to VRB and VTprg. In an exemplary memory having rows of 512 cells organized by 8, there are 64 bytes. The successive triple reading of these 64 bytes lasts for approximately 32 microseconds (allowing 150 nanoseconds for the reading of each byte). This duration approaches that of a write cycle of a cell (comprising the normal steps of a prerequisite erasure and actual write) which takes approximately 2 milliseconds. The cost, in terms of time, of the method of the present invention is therefore negligible when it is carried out at the same time as a write cycle.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. A method for writing a particular cell into a group of memory cells within a row of memory cells of an electrically programmable memory, each cell comprising only one floating gate transistor, comprising the steps of:

reading a state of at least one of the memory cells within the row by using different read reference values to generate at least two readings for said at least one of the memory cells within the row;

verifying the compatibility of the said at least two readings of the said at least one of the memory cells;

when an absence of compatibility is found for the said at least one of the memory cells, rewriting at least the memory cells of the group of memory cells within the row in which the group of memory cells resides; and writing the particular cell into the group of memory cells.

2. The method of claim 1, wherein:

the at least two readings includes three readings; and the step of reading a state of at least one of the memory cells includes comparing one of a read voltage and read current supplied by the one memory cell with one of a reference voltage and reference current, the one of a reference voltage and reference current being a central value for a first of the three readings, a first auxiliary value that is greater than the central value for a second of the three readings, and a second auxiliary value that is less than the central value for a third of the three readings.

3. The method of claim 2, further comprising the steps of:

reading a previously stored value from each of the memory cells within the row by using the central value; storing the previously stored value for each of the memory cells in a register; and when the absence of compatibility is found for the one memory cell, rewriting the previously stored value into each of the memory cells within the row.

4. The method of claim 3, wherein, wherein the step of reading a previously stored value from each of the memory cells includes reading the previously stored value by using only the central value when the an absence of compatibility is found for the one memory cell.

5. The method of claim 3, wherein the step of reading the state of at least one of the memory cells includes reading a state of a second one of the at least one memory cells by using only two different read reference values to generate two readings, when the two different readings of the second cell are indicative of a non-compatibility.

6. The method of claim 1, wherein the step of reading the state of at least one of the memory cells includes reading a state of each of only a subset of the group of memory cells that does not include all of the group of memory cells.

7. The method of claim 1, wherein the rewriting of the at least one of memory cells is performed simultaneously with the writing of the particular cell.

8. An electrically programmable memory comprising:

a plurality of memory cells arranged in rows;

means for performing three successive reads of a memory cell of a row by applying three different reference potentials to a terminal of the memory cell to generate three readings prior to a write of a word into the row; and means for rewriting a word into the row when the three readings give non-compatible results for at least one cell of the row.

9. The electrically programmable memory of claim 8, wherein the means for performing includes means for applying the three different reference potentials to a control gate terminal of the memory cell.

10. An electrically programmable memory comprising:

a network of cells organized in rows of words;

a read circuit, coupled to the network of cells, having an output that provides three different reference values to a first cell of the network of cells, to read three corresponding read values of the first cell;

a register, coupled to the read circuit, that stores the three corresponding read values;

a write sequencer, coupled to the network of cells, having an input that receives a write command to write an input word to a selected cell within a row of the memory, a first output that applies three different read values to at least one cell within the row to read three read results of the at least one cell, a second output that provides a rewrite to the defective cell within the row in response to a systematic rewrite command, and a third output that writes the input word to the write cell; and means, coupled to the write sequencer, for comparing the three read results to determine whether the defective cell is detected, and for providing the systematic rewrite command to the write sequencer when the defective cell is detected.

11. The electrically programmable memory of claim 8, wherein the means for rewriting includes means for rewriting a value of the word that was previously stored in the row.

12. The electrically programmable memory of claim 11, further comprising means for determining the value of the word that was previously stored in the row based upon the three readings.

13. The electrically programmable memory of claim 8, wherein the three different reference potentials include a central value that is a midpoint between a programming threshold voltage and an erasing threshold voltage of the memory cell, a first auxiliary value that is greater than the central value, and a second auxiliary value that is less than the central value.

14. The electrically programmable memory of claim 8, wherein the means for performing three successive reads includes means for performing only first and second successive reads on a particular memory cell of the row when the first and second successive reads give non-compatible results.

15. The electrically programmable memory of claim 10, wherein the second output of the write sequencer provides a previously stored rewrite value to the defective cell.

16. The electrically programmable memory of claim 15, further comprising means for determining the previously stored rewrite value based upon the three read results.

17. The electrically programmable memory of claim 10, wherein the three different read values include a central value that is a midpoint between a programming threshold voltage and an erasing threshold voltage of a memory cell within the network of cells, a first auxiliary value that is greater than the central value, and a second auxiliary value that is less than the central value.

18. The electrically programmable memory of claim 10, wherein:

the means for comparing the three read results includes means for comparing the first two of the three read results to determine whether the defective cell is detected; and the first output of the write sequencer provides only two of the three different read values when the defective cell is detected.

19. The electrically programmable memory of claim 10, wherein the output of the read circuit provides three different reference values to a control gate terminal of the first cell.

20. A method for determining a degradation of a memory device, the method comprising the steps of:

applying a first voltage to a memory cell within the memory device to generate a first read value of the memory cell;

applying a second voltage that is different from the first voltage to the memory cell within the memory device to generate a second read value of the memory cell; and comparing the first read value to the second read value.

21. The method of claim 20, further comprising a step of applying a third voltage that is different from the first voltage to the memory cell within the memory device to generate a third read value of the memory cell, and wherein the step of comparing includes comparing the third read value to the first read value and the second read value.

22. The method of claim 10, wherein:

the step of applying a first voltage includes applying a central value that is a midpoint between a programming threshold voltage and an erasing threshold voltage of the memory cell;

the step of applying a second voltage includes applying a second auxiliary value that is less than the central value; and the step of applying a third voltage includes applying a third auxiliary value that is greater than the central value.

23. The method of claim 20, the method being further for correcting the degradation of the memory device, the method further comprising the step of rewriting a previously stored value into the memory cell when the step of comparing determines that the memory cell has degraded.

24. The method of claim 23, wherein the step of comparing includes determining the previously stored value.

25. The method of claim 23, further comprising a step, performed prior to the step of rewriting, of storing the previously stored value.

26. The method of claim 23, wherein the memory cell is within a row of memory cells within the memory device, the method further comprising the step of rewriting a previously stored value into each of the memory cells within the row.

27. The method of claim 20, wherein:

the step of applying a first voltage includes applying the first voltage to a control gate terminal of the memory cell; and the step of applying a second voltage includes applying the second voltage to the control gate terminal of the memory cell.

28. An apparatus for determining a degradation of a memory device, the apparatus comprising:

means for applying a first voltage to a memory cell within the memory device to generate a first read value of the memory cell;

means for applying a second voltage that is different from the first voltage to the memory cell within the memory device to generate a second read value of the memory cell; and means for comparing the first read value to the second read value.

29. The apparatus of claim 24, further comprising means for applying a third voltage that is different from the first voltage to the memory cell within the memory device to generate a third read value of the memory cell, and wherein the means for comparing includes means for comparing the third read value to the first read value and the second read value.

30. The apparatus of claim 29, wherein:

the means for applying a first voltage includes means for applying a central value that is a midpoint between a programming threshold voltage and an erasing threshold voltage of the memory cell;

the means for applying a second voltage includes means for applying a second auxiliary value that is less than the central value; and the means for applying a third voltage includes means for applying a third auxiliary value that is greater than the central value.

31. The apparatus of claim 28, the apparatus being further for correcting the degradation of the memory device, the apparatus further comprising means for rewriting a previously stored value into the memory cell when the means for comparing determines that the memory cell has degraded.

32. The apparatus of claim 31, wherein the means for comparing includes means for determining the previously stored value.

33. The apparatus of claim 32, further comprising means for storing the previously stored value.

34. The apparatus of claim 28, wherein the memory cell is within a row of memory cells within the memory device, the apparatus further comprising means for rewriting a previously stored value into each of the memory cells within the row.

35. The apparatus of claim 28, in combination with the memory device.

36. The apparatus of claim 28, wherein:

the means for applying a first voltage includes means for applying the first voltage to a control gate terminal of the memory cell; and the means for applying a second voltage includes means for applying the second voltage to the control gate terminal of the memory cell.

37. A memory device comprising:

a plurality of memory cells, each of which is readable by application of a read voltage; and means for determining a likelihood that the memory device has a degraded state by applying each of a plurality of read voltages to a terminal of a first cell of the plurality of memory cells to generate a plurality of read results.

38. The memory device of claim 37, wherein a group of the plurality of memory cells are arranged in a row that includes the cell, the memory device further comprising means for rewriting a previously stored value into each of the group of memory cells when the means for determining determines that the first cell has a degraded state.

39. The memory device of claim 37, wherein the plurality of read voltages includes a central value that is a midpoint between a programming threshold voltage and an erasing threshold voltage of the first cell, a first auxiliary value that is greater than the central value, and a second auxiliary value that is less than the central value.

40. The memory device of claim 37, wherein the means for determining includes means for comparing each of the plurality of read results with one another.

41. The memory device of claim 37, wherein:

a group of the plurality of memory cells are arranged in a row that includes the first cell; and the means for determining includes means for determining the likelihood by applying each of the plurality of read voltages whenever a write is performed on any cell of the group of memory cells.

42. The memory device of claim 37, wherein:

a group of the plurality of memory cells are arranged in a row that includes the first cell; and the means for determining includes means for determining the likelihood by applying each of the plurality of read voltages whenever a read is performed on any cell of the group of memory cells.

43. The memory device of claim 37, wherein the terminal of the first cell is a control gate terminal of the first cell.

44. A memory device comprising:

a plurality of memory cells, each of which is readable by application of a read voltage;

a read circuit, having an output that provides each of a plurality of read voltages to a terminal of a first cell of the plurality of memory cells to generate a plurality of read results; and a comparator circuit, having an input that receives the plurality of read results from the read circuit and an output that provides an indication that a first cell of the plurality of memory cells has a degraded state.

45. The memory device of claim 44, wherein:

a group of the plurality of memory cells are arranged in a row that includes the first cell; and the memory device further comprises a write circuit having an output that rewrites a previously stored value into each of the group of memory cells when the output of the comparator circuit indicates that the first cell has a degraded state.

46. The memory device of claim 44, wherein the plurality of read voltages includes a central value that is a midpoint between a programming threshold voltage and an erasing threshold voltage of the first cell, a first auxiliary value that is greater than the central value, and a second auxiliary value that is less than the central value.

47. The memory device of claim 44, wherein:

a group of the plurality of memory cells are arranged in a row that includes the first cell; and the output of the read circuit provides each of the plurality of read voltages to the first cell whenever a write is performed on any cell of the group of memory cells.

48. The memory device of claim 44, wherein:

a group of the plurality of memory cells are arranged in a row that includes the first cell; and the output of the read circuit provides each of the plurality of read voltages to the first cell whenever a read is performed on any cell of the group of memory cells.

49. The memory device of claim 44, wherein the terminal of the first cell is a control gate terminal of the first cell.

* * * * *